United States Patent
Hooshmand et al.

(10) Patent No.: US 11,131,713 B2
(45) Date of Patent: Sep. 28, 2021

(54) DEEP LEARNING APPROACH FOR BATTERY AGING MODEL

(71) Applicant: NEC Laboratories America, Inc., Princeton, NJ (US)

(72) Inventors: Ali Hooshmand, San Jose, CA (US); Mehdi Assefi, Sunnyvale, CA (US); Ratnesh Sharma, Freemont, CA (US)

(73) Assignee: NEC CORPORATION

( * ) Notice: Subject to any disclaimer, the term of this patent is extended or adjusted under 35 U.S.C. 154(b) by 353 days.

(21) Appl. No.: 16/273,505

(22) Filed: Feb. 12, 2019

(65) Prior Publication Data
US 2019/0257886 A1 Aug. 22, 2019

Related U.S. Application Data

(60) Provisional application No. 62/633,156, filed on Feb. 21, 2018.

(51) Int. Cl.
| | |
|---|---|
| *G01R 31/367* | (2019.01) |
| *G06N 3/08* | (2006.01) |
| *G06N 3/04* | (2006.01) |
| *H01M 10/42* | (2006.01) |
| *G06N 20/20* | (2019.01) |
| *G01R 31/382* | (2019.01) |
| *G06F 17/18* | (2006.01) |

(52) U.S. Cl.
CPC ........ *G01R 31/367* (2019.01); *G01R 31/382* (2019.01); *G06F 17/18* (2013.01); *G06N 3/0454* (2013.01); *G06N 3/084* (2013.01); *G06N 20/20* (2019.01); *H01M 10/4285* (2013.01)

(58) Field of Classification Search
CPC .. G01R 31/367; G01R 31/382; G01R 31/392; G06N 3/084; G06N 3/0454; G06N 20/20; G06N 3/0445; G06N 3/0481; H01M 10/4285; G06F 17/18; Y02E 60/10
See application file for complete search history.

(56) References Cited

U.S. PATENT DOCUMENTS

| | | | |
|---|---|---|---|
| 5,525,890 A * | 6/1996 | Iwatsu | G01R 31/3648 320/106 |
| 6,369,545 B1 * | 4/2002 | Williams | H02J 7/35 320/101 |
| 8,719,195 B2 | 5/2014 | Frisch et al. | |
| 8,751,845 B2 | 6/2014 | Assad et al. | |
| (Continued) | | | |

OTHER PUBLICATIONS

Veeraraghavan et al. (Battery Aging Estimation with Deep Learning, 2017) (Year: 2017).*

*Primary Examiner* — Mohammad K Islam
(74) *Attorney, Agent, or Firm* — Joseph Kolodka (57) ABSTRACT

A computer-implemented method predicting a life span of a battery storage unit by employing a deep neural network is presented. The method includes collecting energy consumption data from one or more electricity meters installed in a structure, analyzing, via a data processing component, the energy consumption data, removing one or more features extracted from the energy consumption data via a feature engineering component, partitioning the energy consumption data via a data partitioning component, and predicting battery capacity of the battery storage unit via a neural network component sequentially executing three machine learning techniques.

17 Claims, 9 Drawing Sheets

(56) References Cited

U.S. PATENT DOCUMENTS

| | | | |
|---|---|---|---|
| 9,446,678 B2 | 9/2016 | Meyer | |
| 9,772,672 B2 | 9/2017 | Li et al. | |
| 10,547,180 B2* | 1/2020 | Crawford | G05B 19/05 |
| 2007/0182385 A1* | 8/2007 | Ueda | H02J 7/0048 |
| | | | 323/211 |
| 2010/0017155 A1 | 1/2010 | Nareid | |
| 2010/0250162 A1 | 9/2010 | White et al. | |
| 2011/0082621 A1 | 4/2011 | Berkobin et al. | |
| 2012/0059527 A1* | 3/2012 | Beaston | H02J 3/32 |
| | | | 700/295 |
| 2014/0092375 A1* | 4/2014 | Raghavan | H01M 10/48 |
| | | | 356/32 |
| 2016/0239592 A1 | 8/2016 | Pourmousavi Kani | |
| 2017/0117841 A1 | 4/2017 | Watanabe et al. | |
| 2017/0206464 A1* | 7/2017 | Clayton | G06N 3/0445 |
| 2017/0249004 A1 | 8/2017 | Flores Assad et al. | |
| 2017/0292998 A1 | 10/2017 | Vidhi et al. | |
| 2018/0086222 A1* | 3/2018 | Juang | H02J 7/0063 |
| 2018/0143257 A1* | 5/2018 | Garcia | G01R 31/382 |
| 2019/0056452 A1* | 2/2019 | You | G01R 31/3648 |
| 2019/0115753 A1* | 4/2019 | Sheehan | H02J 3/00 |
| 2019/0157891 A1* | 5/2019 | Chemali | G06N 3/04 |
| 2020/0014238 A1* | 1/2020 | Daniels | G01R 31/392 |
| 2020/0081070 A1* | 3/2020 | Chemali | G06N 3/08 |

\* cited by examiner

DEEP LEARNING APPROACH FOR BATTERY AGING MODEL

RELATED APPLICATION INFORMATION

This application claims priority to Provisional Application No. 62/633,156, filed on Feb. 21, 2018, incorporated herein by reference in its entirety.

BACKGROUND

Technical Field

The present invention relates to energy management systems and, more particularly, to methods and systems applying a deep learning approach for a battery aging model.

Description of the Related Art

Battery lifetime prognosis models from post processing to performance degradation has been a longstanding topic in the research community. Every successful battery manufacturer requires an accurate lifetime prediction model. An increasing number of electric and hybrid vehicles as well as energy storage devices and the amount of the data generated by them can help manufacturers to have a better prediction of the expected lifetime of their products. However, the use of this wealth of data with the state of the art data analytics techniques has been very limited so far and little is known about the content with respect to lifetime prognosis.

SUMMARY

A computer-implemented method for predicting a life span of a battery storage unit by employing a deep neural network is presented. The method includes collecting energy consumption data from one or more electricity meters installed in a structure, analyzing, via a data processing component, the energy consumption data, removing one or more features extracted from the energy consumption data via a feature engineering component, partitioning the energy consumption data via a data partitioning component, and predicting battery capacity of the battery storage unit via a neural network component sequentially executing three machine learning techniques.

A system for predicting a life span of a battery storage unit by employing a deep neural network is also presented. The system includes a memory and a processor in communication with the memory, wherein the processor is configured to collect energy consumption data from one or more electricity meters installed in a structure, analyze, via a data processing component, the energy consumption data, remove one or more features extracted from the energy consumption data via a feature engineering component, partition the energy consumption data via a data partitioning component, and predict battery capacity of the battery storage unit via a neural network component sequentially executing three machine learning techniques.

A non-transitory computer-readable storage medium comprising a computer-readable program is presented for predicting a life span of a battery storage unit by employing a deep neural network, wherein the computer-readable program when executed on a computer causes the computer to perform the steps of collecting energy consumption data from one or more electricity meters installed in a structure, analyzing, via a data processing component, the energy consumption data, removing one or more features extracted from the energy consumption data via a feature engineering component, partitioning the energy consumption data via a data partitioning component, and predicting battery capacity of the battery storage unit via a neural network component sequentially executing three machine learning techniques.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

The exemplary embodiments of the present invention aid in the design and development of deep neural network strategies to monitor the behavior of lithium-ion batteries and predict a battery lifetime under different scenarios. It has been previously shown that the temperature, charge/discharge rates, maximum/minimum State of the Charge (SOC), and throughput are important parameters and statistically significant. The exemplary embodiments of the present invention develop intelligent, efficient, and scalable prediction solutions on deep learning infrastructures, which will consider both cycle-related and calendar aging, as well as interactions between different parameters.

The exemplary embodiments of the present invention employ multiple deep learning analytics components, sequentially, to harness data and turn such data into high quality knowledge and facts. Deep neural networks are employed to improve accuracy and efficiency of predictive models to monitor behaviors of batteries and make real-time suggestions or recommendations or forecasts for users to improve the lifetime of the product and also prepare a more accurate prediction for manufacturers to decide on warranty rules for their products. As a baseline, a Random Forest prediction model and a Neural Network can be employed.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
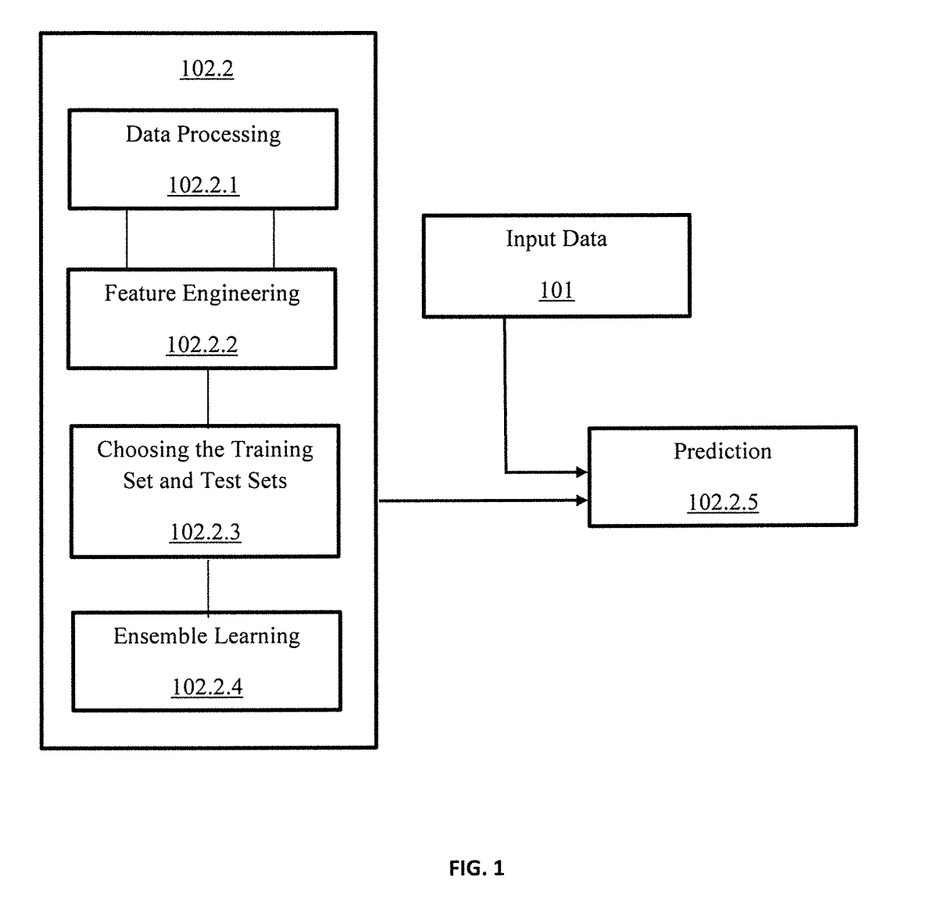
FIG. 1 is a block/flow diagram illustrating a configuration of a battery aging model, in accordance with embodiments of the present invention.
Figure 2:
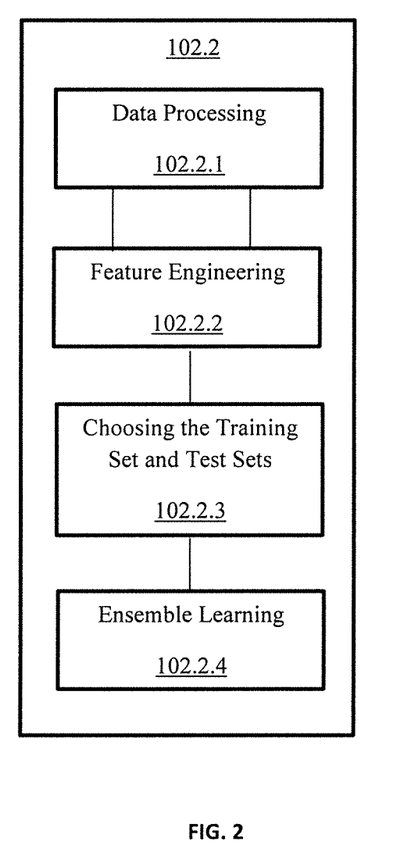
FIG. 2 is a block/flow diagram illustrating a configuration of pre-processing and designing the neural network, in accordance with embodiments of the present invention.

FIG. 1 is a block/flow diagram illustrating a configuration of a battery aging model, in accordance with embodiments of the present invention, whereas FIG. 2 is a block/flow diagram illustrating a configuration of pre-processing and designing the neural network, in accordance with embodiments of the present invention.

In FIG. 1, 102.2 is the behind-the-meter (BTM) storage system or battery storage system/unit which receives measurement readings from electricity meters 102.6 installed between industrial/commercial unit 102.8 and a distribution network 102.4. The BTM storage system or battery storage system 102.2 reduces demand charge by using an optimal discharging schedule during peak load periods.

Regarding block 102.2, which is the battery storage system/unit, the pre-processing and network configuration part includes a data processing unit or component 102.2.1, a feature engineering unit or component 102.2.2, data partitioning unit or component 102.2.3, and a neural network configuration or component 102.2.4. These components are hardware components that are responsible for preparing the dataset, removing unnecessary features, adjusting the format of the data, and managing the data loss and normalization. The battery storage system 102.2 is also responsible for figuring out the topology of the deep neural network.

Regarding block 102.2.1, the data set collected from a battery installation includes the following input data 101:

datetime: Data retrieve date and time
bat_pw_in: Charging power. Unit is watt.
bat_pw_out: Discharging power. Unit is watt.
bat_temp: Maximum temperature of battery. Unit is Celsius degrees.
bat_soc: State of charge.
The output data is:
bat_learning_cap which is the latest capacity measured semi-annually.

Regarding block 102.2.2, in this data set, the features (datetime, charging power, discharging power, max temperature, and battery state of charge) were measured, in one example, for 3 years with 5 minute sampling times.

In case of a small number of samplings, the methods use linear interpolation to create battery capacity measures with the same sampling time as feature inputs at this stage.

The date time can be transformed into a number of seconds passed from a specific date. The converted numbers are so big that they might affect the use of other features. The methods went through another conversion to make the numbers smaller as follows: $(x-1368032760000000000)/(3\times10^{11})$.

To create more variance in output variables (battery capacity), this parameter was changed to faded capacity percentage based on 29 kWh rated capacity.

One of the parameters in battery aging is energy throughput. This feature can be calculated based on charge and discharge power and can be added to the set of input features as follows:

$$\text{Throughput}(t)=\Sigma_{i=0}^{t}|P_{charge}(i)|\times\Delta t+|P_{discharge}(i)|\times\Delta t$$

Regarding block 102.2.4, the methods chose to use three different machine learning algorithms, in sequence or in combination, in predicting of the time series data, that is, Multi Linear Regression (MLR), Neural Network, and Long Short-Term Memory (LSTM) deep learning model.

Figure 3:
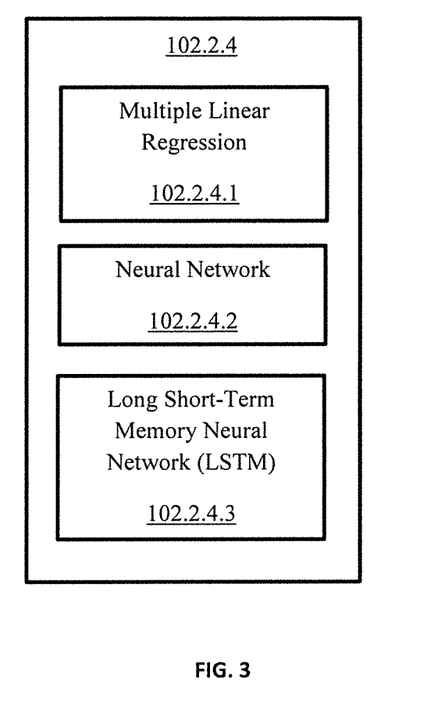
FIG. 3 is a block/flow diagram illustrating a configuration for ensemble learning, in accordance with embodiments of the present invention.

FIG. 3 is a block/flow diagram illustrating a configuration for ensemble learning, in accordance with embodiments of the present invention.

Regarding block 102.2.4.1, the dataset has multiple input features, so using MLR is a simple solution that has been employed. In addition, the capacity at previous time steps was also added as an input feature. Further, the methods normalized the input features by setting the mean of each input to zero and the standard deviation to 1 for the following reasons:

The range of raw input features are very different. In using the normalized data, the effect of none of them will be neglected.

Training the weights of the model is better by using the unbiased input features.

Analyzing the final weights to detect the dominant input features is possible only with having normalized inputs.

The test set is also normalized by using the mean and standard deviation of training data.

sklearn library in python is used to implement the model:
from sklearn import preprocessing
scaler=preprocessing.StandardScaler( ).fit(x_train)
x_train_scaled=scaler.transform(x_train)
x_test, y_test=clean_test.drop(["percentage"], axis=1), clean_test.percentage
x_test_scaled=scaler.transform(x_test)

To test the MLR model, the methods kept the last year of data as the testing set. The resulted prediction is accurate and identical to the actual values. The MLR tool identifies the high correlation between last step faded capacity percentages and the output (due to artificial interpolation that was created) and puts all the weights of prediction on this input. Thus, in real applications, where the methods need to predict the nonlinear behavior of capacity fading this technique won't be effective.

Regarding block 102.2.4.2, a simple neural network is used as the second component of the ensemble learning. The reason for choosing this model is because neural networks have shown to be a promising solution for pattern recognition, time series prediction, and signal processing. In the exemplary model, the methods used one single neuron that performs the prediction. The methods can employ, e.g., Keras plus TensorFlow (python) to train the Neural Network model and predict the battery faded capacity percentage as follows:

model=Sequential( )
model.add(Dense(1, activation=None, input_shape=input_shape))
model.compile(optimizer='adam', loss='mean_squared_error', metrics=['accuracy']

Keras is an open source neural network library written in Python. It is capable of running on top of TensorFlow. TensorFlow is an open-source software library for dataflow programming across a range of tasks. It is a symbolic math library, and is also used for machine learning applications such as neural networks.

Figure 4:
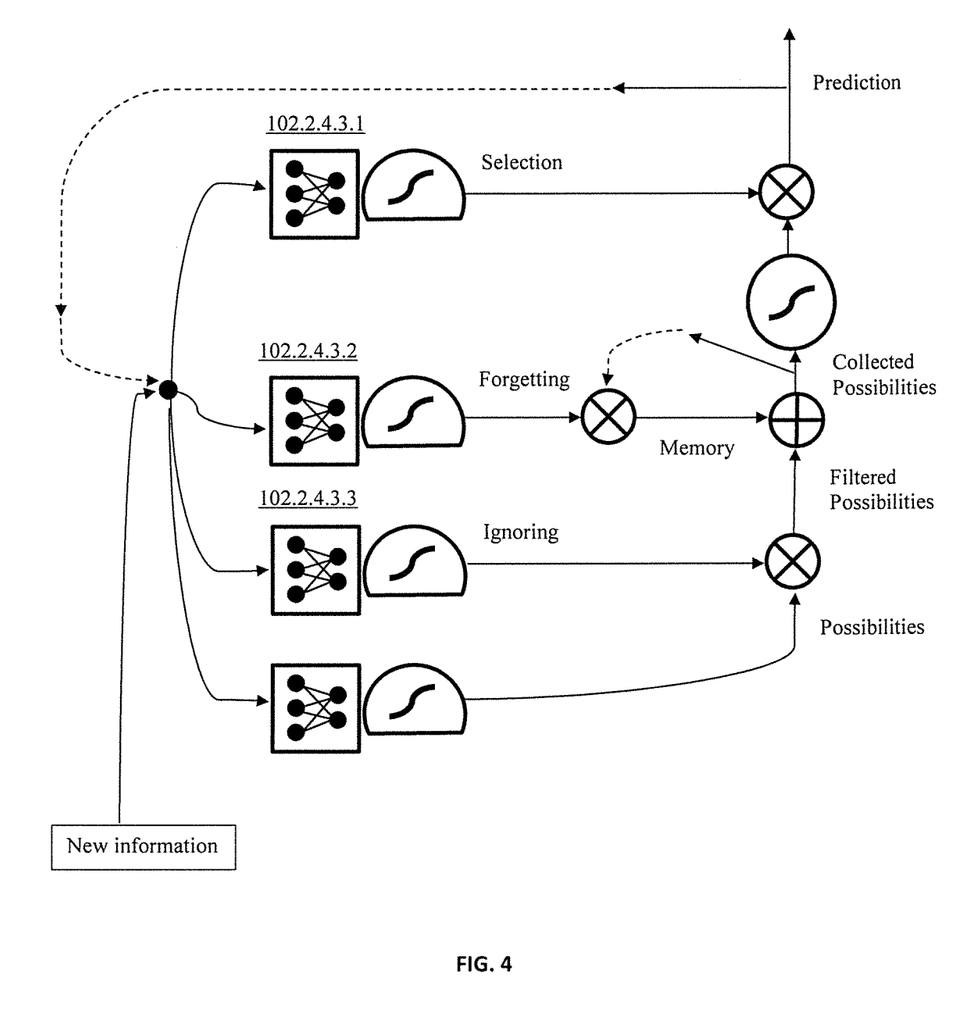
FIG. 4 is a block/flow diagram illustrating a node in an Long Short-Term memory (LSTM) neural network, in accordance with embodiments of the present invention.

Regarding block 102.2.4.3, a common architecture of LSTM includes a memory cell, an input gate, an output gate, and a forget gate.

An LSTM (memory) cell stores a value (or state), for either long or short time periods. This is achieved by using an identity activation function for the memory cell. In this way, when an LSTM network (that is a recurrent neural network (RNN) including LSTM units) is trained with backpropagation through time, the gradient does not tend to vanish.

The LSTM gates compute activation, often using the logistic function. Intuitively, the input gate controls the extent to which a new value flows into the cell, the forget gate controls the extent to which a value remains in the cell and the output gate controls the extent to which the value in the cell is used to compute the output activation of the LSTM unit.

There are connections into and out of these gates. A few connections are recurrent. The weights of these connections, which need to be learned during training, of an LSTM unit are used to direct the operation of the gates. Each of the gates has its own parameters, which are weights and biases, from possibly other units outside the LSTM unit.

FIG. 4 is a block/flow diagram illustrating a node in a Long Short-Term memory (LSTM) neural network, in accordance with embodiments of the present invention.

Regarding block 102.2.4.3.1, the selection gate decides which possibilities should be passed to the prediction section.

Regarding block 102.2.4.3.2, the forgetting gate is a subnet that decides which parts of the previous information collected from the time series shouldn't affect the prediction anymore:

$f_t = \sigma_g(W_f x_t + U_f h_{t-1} + b_f)$ $i_t = \sigma_g(W_i x_t + U_i h_{t-1} + b_i)$ $o_t = \sigma_g(W_o x_t + U_o h_{t-1} + b_o)$ $c_t = f_t \circ c_{t-1} + i_t \circ \sigma_c(W_c x_t + U_c h_{t-1} + b_c)$ $h_t = o_t \circ \sigma_h(c_t)$ In the equations above, each variable in lowercase italics represents a vector. Matrices $W_q$ and $U_q$ collect, respectively, the weights of the input and recurrent connections, where q can be input gate I, output gate o, the forget gate f, or the cell memory c.

Regarding block 102.2.4.3.3, the ignoring gate decides what previous predictions should be ignored from the future prediction while they stay in the memory until the neural network decides to use or remove them.

Regarding block 102.2.5, with a trained LSTM deep learning model, all weights of the graph are calculated so that the loss value is minimized with every possible input. Each row of the dataset includes, e.g., seven features by which the LSTM is trained. By feeding the data to the network, the LSTM calculates the output value, which is the predicted battery capacity based on the input.

The exemplary embodiments of the present invention employ a deep learning battery aging model that is designed and developed to provide a more accurate battery lifetime prognosis model. The exemplary model is able to employ the available time-series of data showing the battery performance, and, thus, produces more accurate lifetime prognosis.

Figure 5:
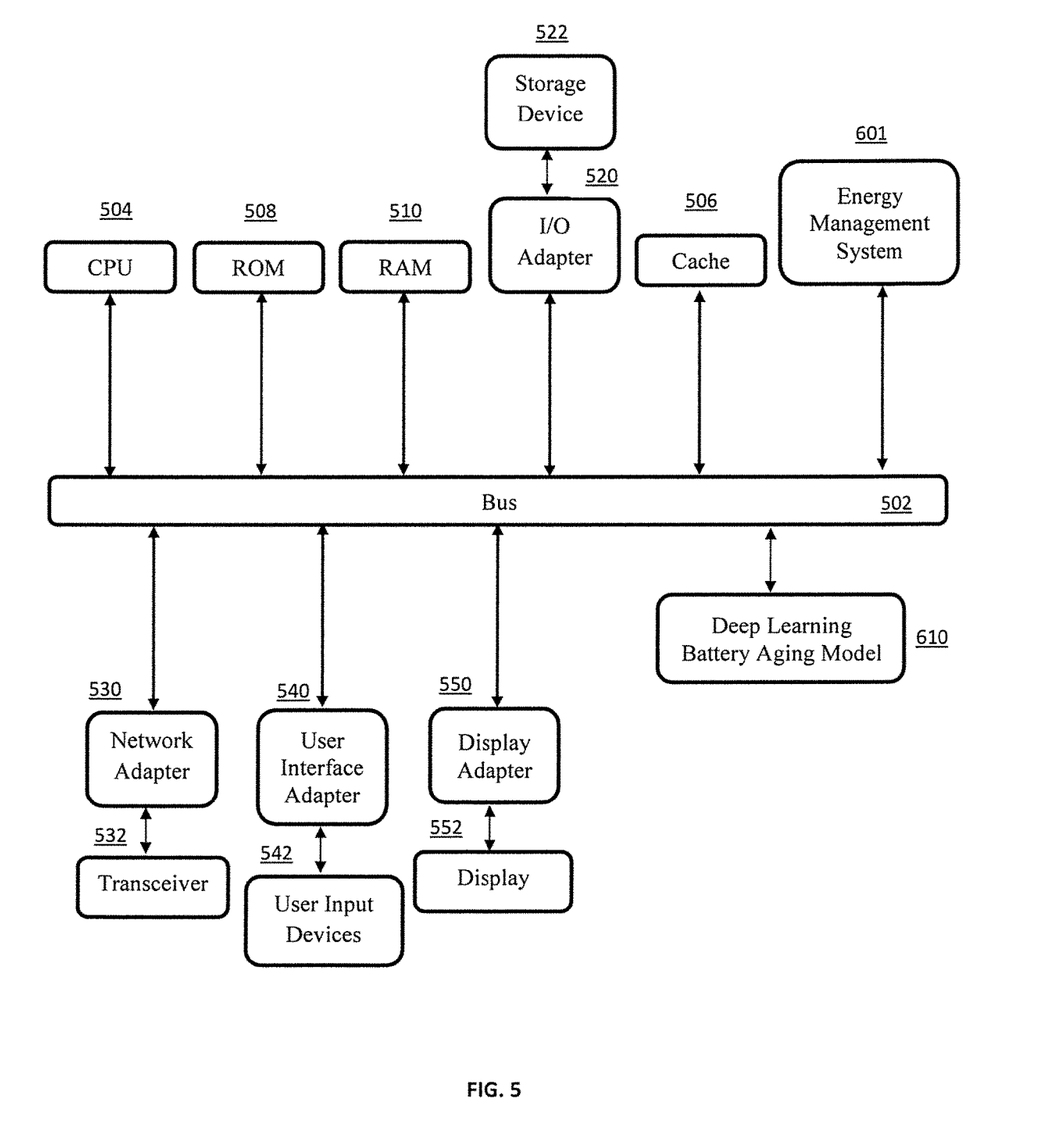
FIG. 5 is an exemplary processing system for a battery lifespan predicting model, in accordance with embodiments of the present invention.

FIG. 5 is an exemplary processing system for a battery lifespan predicting model, in accordance with embodiments of the present invention.

The processing system includes at least one processor (CPU) 504 operatively coupled to other components via a system bus 502. A cache 506, a Read Only Memory (ROM) 508, a Random Access Memory (RAM) 510, an input/output (I/O) adapter 520, a network adapter 530, a user interface adapter 540, and a display adapter 550, are operatively coupled to the system bus 502. Additionally, an energy management system 601 is operatively coupled to the system bus 502. The energy management system 601 can communicate with a deep learning battery aging model 610.

A storage device 522 is operatively coupled to system bus 502 by the I/O adapter 520. The storage device 522 can be any of a disk storage device (e.g., a magnetic or optical disk storage device), a solid state magnetic device, and so forth.

A transceiver 532 is operatively coupled to system bus 502 by network adapter 530.

User input devices 542 are operatively coupled to system bus 502 by user interface adapter 540. The user input devices 542 can be any of a keyboard, a mouse, a keypad, an image capture device, a motion sensing device, a microphone, a device incorporating the functionality of at least two of the preceding devices, and so forth. Of course, other types of input devices can also be used, while maintaining the spirit of the present invention. The user input devices 542 can be the same type of user input device or different types of user input devices. The user input devices 542 are used to input and output information to and from the processing system.

A display device 552 is operatively coupled to system bus 502 by display adapter 550.

Of course, the energy management processing system may also include other elements (not shown), as readily contemplated by one of skill in the art, as well as omit certain elements. For example, various other input devices and/or output devices can be included in the system, depending upon the particular implementation of the same, as readily understood by one of ordinary skill in the art. For example, various types of wireless and/or wired input and/or output devices can be used. Moreover, additional processors, controllers, memories, and so forth, in various configurations can also be utilized as readily appreciated by one of ordinary skill in the art. These and other variations of the energy management processing system are readily contemplated by one of ordinary skill in the art given the teachings of the present invention provided herein.

Figure 6:
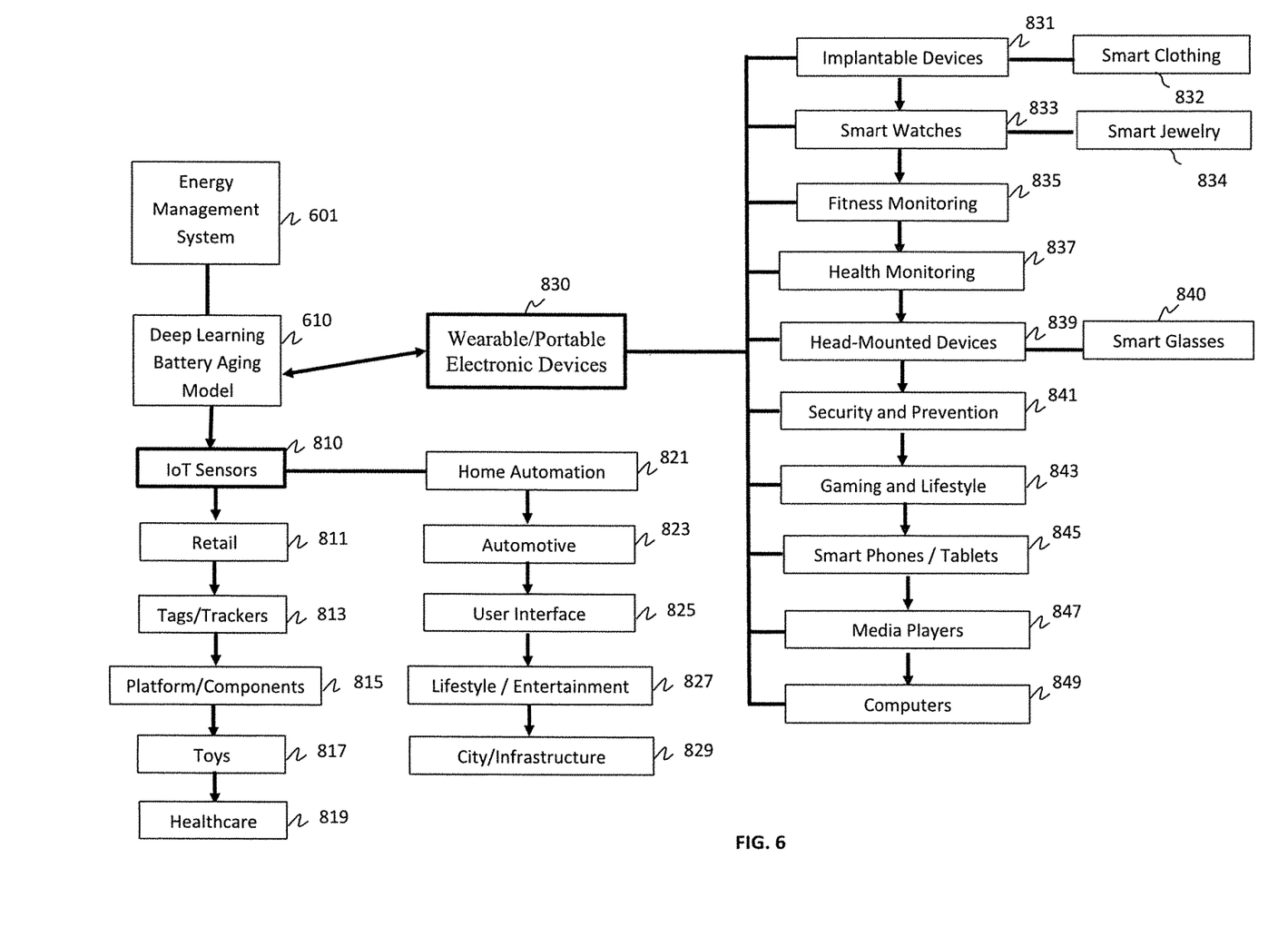
FIG. 6 is a block/flow diagram of an exemplary method for implementing a battery lifespan predicting model in Internet of Things (IoT) systems or devices or infrastructure, in accordance with embodiments of the present invention.

FIG. 6 is a block/flow diagram of an exemplary method for implementing a battery lifespan predicting model in Internet of Things (IoT) systems or devices or infrastructure, in accordance with embodiments of the present invention.

According to some exemplary embodiments of the invention, an energy management system is implemented using an IoT methodology, in which a large number of ordinary items are utilized in the vast infrastructure of an energy management system.

IoT enables advanced connectivity of computing and embedded devices through internet infrastructure. IoT involves machine-to-machine communications (M2M), where it is important to continuously monitor connected machines to detect any anomaly or bug, and resolve them quickly to minimize downtime.

The energy management system or ESS 601 can communicate with, e.g., wearable, implantable, or ingestible electronic devices and Internet of Things (IoT) sensors. The wearable, implantable, or ingestible devices can include at least health and wellness monitoring devices, as well as fitness devices. The wearable, implantable, or ingestible devices can further include at least implantable devices, smart watches, head-mounted devices, security and prevention devices, and gaming and lifestyle devices. The IoT sensors can be incorporated into at least home automation applications, automotive applications, user interface applications, lifestyle and/or entertainment applications, city and/or infrastructure applications, toys, healthcare, fitness, retail tags and/or trackers, platforms and components, etc. The energy management system or ESS 601 described herein can communicate with any type of electronic devices for any type of use or application or operation.

IoT (Internet of Things) is an advanced automation and analytics system which exploits networking, sensing, big data, and artificial intelligence technology to deliver complete systems for a product or service. These systems allow greater transparency, control, and performance when applied to any industry or system.

IoT systems have applications across industries through their unique flexibility and ability to be suitable in any environment. IoT systems enhance data collection, automation, operations, and much more through smart devices and powerful enabling technology.

IoT systems allow users to achieve deeper automation, analysis, and integration within a system. IoT improves the reach of these areas and their accuracy. IoT utilizes existing and emerging technology for sensing, networking, and robotics. Features of IoT include artificial intelligence, connectivity, sensors, active engagement, and small device use. In various embodiments, the energy management system 601 of the present invention can communicate with a variety of different devices and/or systems. For example, the energy management system 601 can communicate with wearable or portable electronic devices 830. Wearable/portable electronic devices 830 can include implantable devices 831, such as smart clothing 832. Wearable/portable devices 830 can include smart watches 833, as well as smart jewelry 834. Wearable/portable devices 830 can further include fitness monitoring devices 835, health and wellness monitoring devices 837, head-mounted devices 839 (e.g., smart glasses 840), security and prevention systems 841, gaming and lifestyle devices 843, smart phones/tablets 845, media players 847, and/or computers/computing devices 849.

The energy management system 601 of the present invention can further communicate with Internet of Thing (IoT) sensors 810 for various applications, such as home automation 821, automotive 823, user interface 825, lifestyle and/or entertainment 827, city and/or infrastructure 829, retail 811, tags and/or trackers 813, platform and components 815, toys 817, and/or healthcare 819. Of course, one skilled in the art can contemplate such energy management system 601 communicating with any type of electronic devices for any types of applications, not limited to the ones described herein.

Figure 7:
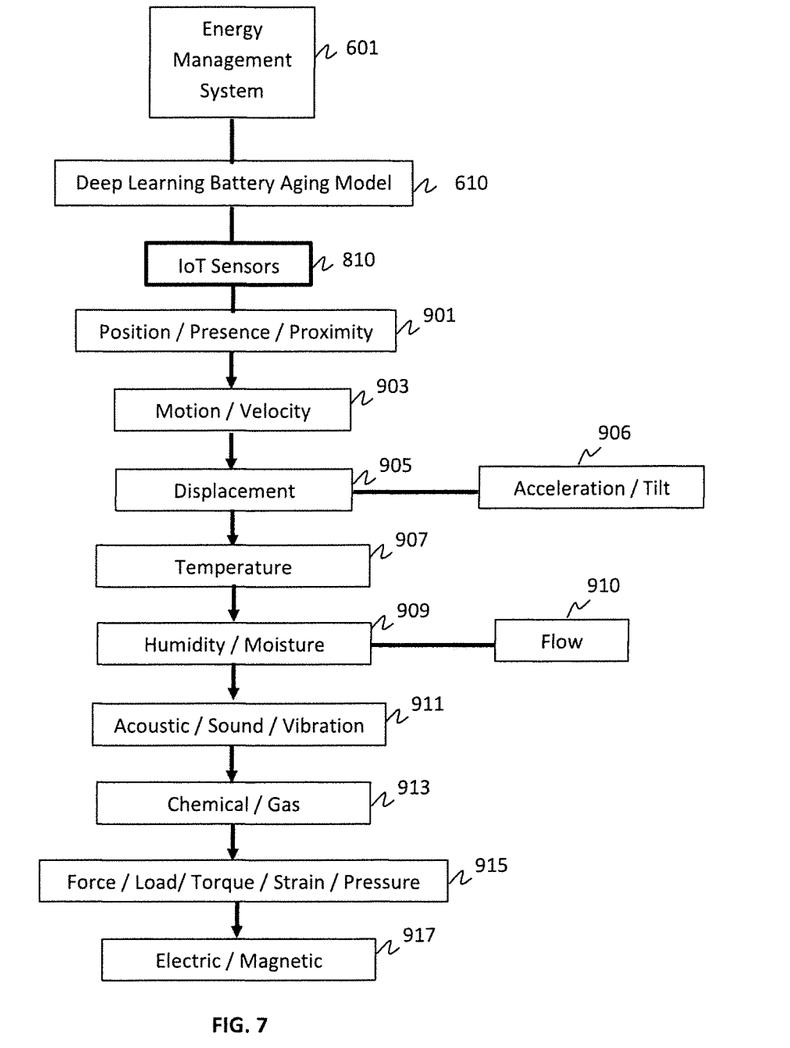
FIG. 7 is a block/flow diagram of exemplary IoT sensors used to collect data/information related to a battery lifespan predicting model, in accordance with embodiments of the present invention.

FIG. 7 is a block/flow diagram of exemplary IoT sensors used to collect data/information related to a battery lifespan predicting model, in accordance with embodiments of the present invention.

IoT loses its distinction without sensors. IoT sensors act as defining instruments which transform IoT from a standard passive network of devices into an active system capable of real-world integration.

The IoT sensors 810 can be connected via the energy management system 601 to transmit information/data, continuously and in in real-time. Exemplary IoT sensors 810 can include, but are not limited to, position/presence/proximity sensors 901, motion/velocity sensors 903, displacement sensors 905, such as acceleration/tilt sensors 906, temperature sensors 907, humidity/moisture sensors 909, as well as flow sensors 910, acoustic/sound/vibration sensors 911, chemical/gas sensors 913, force/load/torque/strain/pressure sensors 915, and/or electric/magnetic sensors 917. One skilled in the art can contemplate using any combination of such sensors to collect data/information and input into the modules 610, 611 of the energy management system 601 for further processing. One skilled in the art can contemplate using other types of IoT sensors, such as, but not limited to, magnetometers, gyroscopes, image sensors, light sensors, radio frequency identification (RFID) sensors, and/or micro flow sensors. IoT sensors can also include energy modules, power management modules, RF modules, and sensing modules. RF modules manage communications through their signal processing, WiFi, ZigBee®, Bluetooth®, radio transceiver, duplexer, etc.

Moreover data collection software can be used to manage sensing, measurements, light data filtering, light data security, and aggregation of data. Data collection software uses certain protocols to aid IoT sensors in connecting with real-time, machine-to-machine networks. Then the data collection software collects data from multiple devices and distributes it in accordance with settings. Data collection software also works in reverse by distributing data over devices. The system can eventually transmit all collected data to, e.g., a central server.

Figure 8:
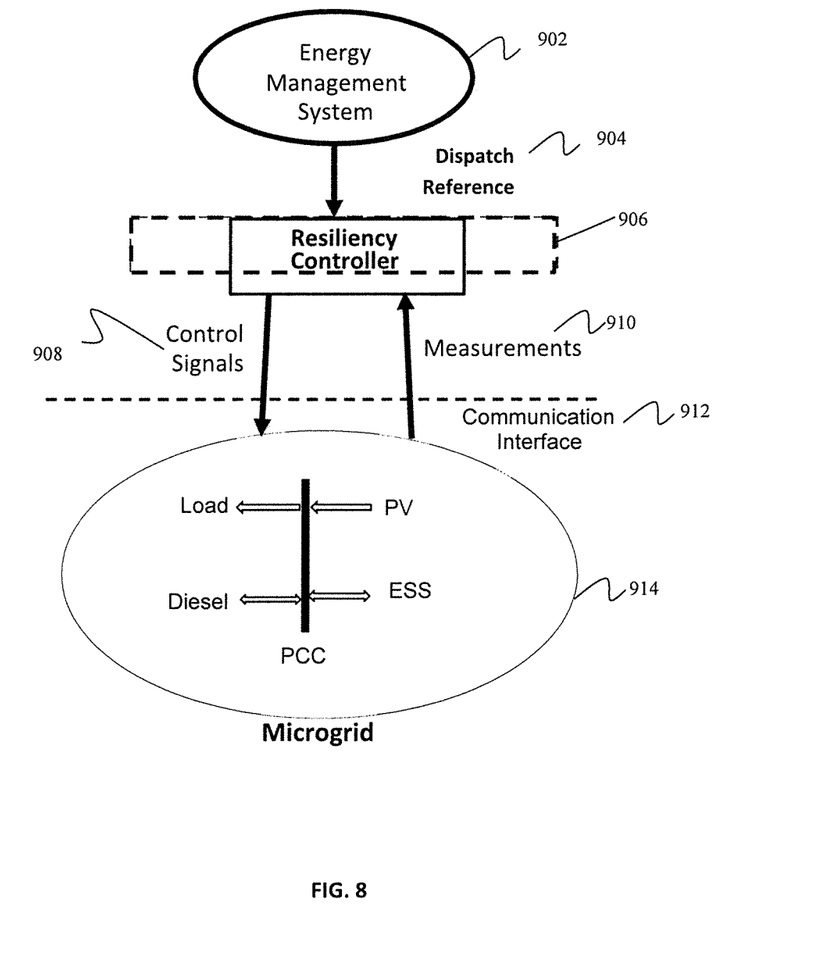
FIG. 8 is a block/flow diagram of a resiliency controller in a microgrid, in accordance with embodiments of the present invention.

FIG. 8 is a block/flow diagram of a resiliency controller in a microgrid, in accordance with embodiments of the present invention.

In FIG. 8, 902 is the energy management system, which sends out the active power dispatch reference 904 of each distributed generator (DG) in a microgrid 914 to the resiliency controller 906. Meanwhile, the resiliency controller 906 collects the measurement data 910 from the microgrid 914 through a communication interface 912. Based on the dispatch reference 904 and measurement data 910, the resiliency controller 906 sends out the control signals 908 to the Distributed Generators (DGs) in the microgrid 914 through the same communication interface 912.

Regarding 902, the Energy Management System is in charge of the economic operation of the microgrid. The Energy Management System needs to realize functions such as unit commitment, economic dispatch, renewable forecasting, etc. The Energy Management System sends out active power dispatch references to the resiliency controller 906 for each DG in the microgrid 904.

Regarding 914, the DGs in the microgrid can be divided into at least three categories:
 C1: Battery Energy Storage System (ESS);
 C2: Traditional generators using fossil fuels, such as the diesel generator;
 C3: Renewable generators, such as PV and Wind;
DGs in C1 and C2 are equipped with droop control in their local controllers. DGs' output active power is related to the microgrid frequency, while DGs' output reactive power is related to the microgrid voltage.

DGs in C3 are equipped with Maximum Power Point Tracking (MPPT) algorithm to harvest the maximum amount of energy under the given weather condition. Meanwhile, they can also be equipped with droop control in their local controllers.

The resiliency controller 906 includes multiple functional modules to control the DGs in the microgrid 914 utilizing system-level information.

Figure 9:
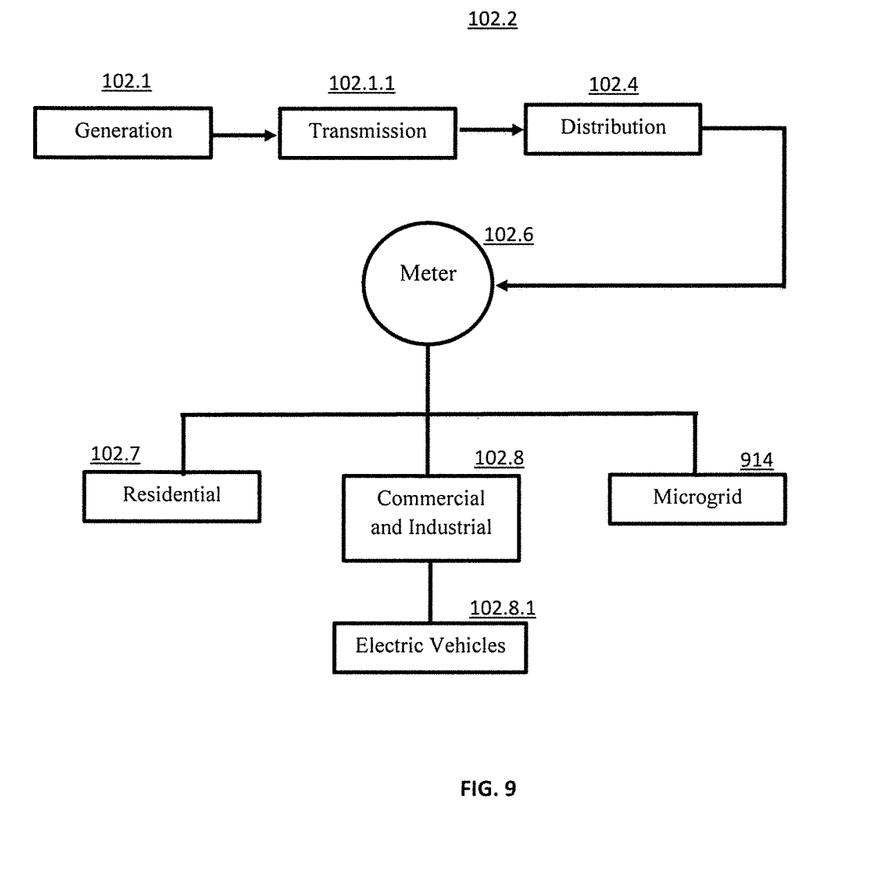
FIG. 9 is a block/flow diagram of a behind-the-meter (BTM) storage system, in accordance with embodiments of the present invention.

FIG. 9 is a block/flow diagram of a behind-the-meter (BTM) storage system, in accordance with embodiments of the present invention.

The BTM storage system 102.2 includes a generation module or component 102.1, a transmission module or component 102.1.1, and a distribution network 102.4 that transmits measurements to one or more meters 102.6. The one or more meters 102.6 feed the stored energy to one or more end users, such as residential users 102.7, commercial and industrial users 102.8, and microgrids 914. The commercial and industrial users 102.8 can further include electric vehicles 102.8.1.

Energy storage provides a way to save previously generated energy and use it at a later time. That energy can be stored as potential, kinetic, chemical, or thermal energy and then can be released in various forms, most commonly as electricity. The ability to bank energy for later use makes energy storage a useful and versatile resource for electric companies and their customers. For electric companies, the largest users and operators of energy storage in the United States, the primary benefits of energy storage are added flexibility, reliability, and resiliency in operating the energy grid. More specifically, energy storage, deployed at the appropriate scale, can be used in various ways to enhance electric company operations, optimize and support the energy grid, and enhance the customer experience.

Storage allows energy grid operators to better manage constant fluctuations in supply and demand. As electric companies integrate more renewable energy resources, like solar and wind, into the energy grid, energy storage can provide more flexibility by helping to manage these variable resources.

Energy storage can help with renewables integration in two primary ways. First, storage can help to address the variability of renewable energy generation. While weather forecasting is improving, there is still uncertainty about when the wind will blow and the sun will shine. Energy storage provides an option for storing wind or solar energy that may be in excess of immediate demand and saving it until demand is high enough to discharge or release it out of storage. In this way, certain storage technologies can allow a variable renewable energy resource to perform like one that is less variable and measurably reliable.

Second, the rapid response time of some types of energy storage makes them effective tools for managing changes in energy output that can occur with some renewables, such as when wind speeds fluctuate or clouds pass over solar panels. In addition to uncontrollable weather changes, there are inherent operational challenges with variable energy resources.

Battery technologies are part of the larger group of electro-chemical storage. There are two categories of battery: solid state and flow batteries. Solid state batteries such as lithium-ion have solid electrodes and solid electrolytes. In contrast, flow batteries, or redox (reduction-oxidation) batteries, operate with two chemical components dissolved in liquids often separated by a membrane, a structure that enables near-instantaneous recharging. Of all of the battery types, lithium-ion is the most popular. Their costs have declined significantly in recent years and, as a result, they are finding applications in electronics, electric vehicles, and industrial operations. Electric companies primarily are using lithium-ion and some lead-acid batteries because of their availability, price, and durability. Battery lifespan varies by type, with solid-state batteries (lithium-ion, zinc, etc.) usually lasting 5-15 years and flow batteries lasting 15-20 years. The exemplary embodiments of the present invention employ deep learning analytics components or deep neural networks to monitor the behavior of batteries to improve the lifetime of the battery storage system.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical data storage device, a magnetic data storage device, or any suitable combination of the foregoing. In the context of this document, a computer readable storage medium may be any tangible medium that can include, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the present invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks or modules.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks or modules.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks or modules.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention. Having thus described aspects of the invention, with the details and particularity required by the patent laws, what is claimed and desired protected by Letters Patent is set forth in the appended claims.

What is claimed is:

1. A computer-implemented method executed on a processor for predicting a life span of a battery storage unit by employing a deep neural network, the method comprising:
    collecting energy consumption data from one or more electricity meters installed in a structure;
    analyzing, via a data processing component, the energy consumption data;
    removing one or more features extracted from the energy consumption data via a feature engineering component;
    partitioning the energy consumption data via a data partitioning component after removing the one or more features; and
    predicting battery capacity of the battery storage unit via a neural network component sequentially executing three machine learning techniques,
    wherein the first machine learning technique is multiple linear regression (MLR), the second machine learning technique involves a neural network model, and the third machine learning technique is a Long Short-Term Memory (LSTM) neural network model.

2. The method of claim 1, wherein test set data in the MLR technique are normalized by using a mean and standard deviation of training data.

3. The method of claim 1, wherein the neural network model is trained to predict a battery faded capacity percentage.

4. The method of claim 1, wherein the LSTM neural network model includes a selection gate, a forgetting gate, and an ignoring gate, where all weights of a graph are calculated so that a loss value is minimized with every input.

5. The method of claim 1, wherein the one or more features extracted from the energy consumption data include date, time, charging power, discharging power, maximum temperature, and battery state of charge (SoC).

6. The method of claim 5, wherein energy throughput is calculated based on the charging power and the discharging power features.

7. A system for predicting a life span of a battery storage unit by employing a deep neural network, the system comprising:
    a memory; and
    a processor in communication with the memory, wherein the processor runs program code to:
        collect energy consumption data from one or more electricity meters installed in a structure;
        analyze, via a data processing component, the energy consumption data;
        remove one or more features extracted from the energy consumption data via a feature engineering component;
        partition the energy consumption data via a data partitioning component after removing the one or more features; and
        predict battery capacity of the battery storage unit via a neural network component sequentially executing three machine learning techniques,
        wherein the first machine learning technique is multiple linear regression (MLR), the second machine learning technique involves a neural network model, and the third machine learning technique is a Long Short-Term Memory (LSTM) neural network model.

8. The system of claim 7, wherein test set data in the MLR technique are normalized by using a mean and standard deviation of training data.

9. The system of claim 7, wherein the neural network model is trained to predict a battery faded capacity percentage.

10. The system of claim 7, wherein the LSTM neural network model includes a selection gate, a forgetting gate, and an ignoring gate, where all weights of a graph are calculated so that a loss value is minimized with every input.

11. The system of claim 7, wherein the one or more features extracted from the energy consumption data include date, time, charging power, discharging power, maximum temperature, and battery state of charge (SoC).

12. The system of claim 11, wherein energy throughput is calculated based on the charging power and the discharging power features.

13. A non-transitory computer-readable storage medium comprising a computer-readable program for predicting a life span of a battery storage unit by employing a deep neural network, wherein the computer-readable program when executed on a computer causes the computer to perform the steps of:
 collecting energy consumption data from one or more electricity meters installed in a structure;
 analyzing, via a data processing component, the energy consumption data;
 removing one or more features extracted from the energy consumption data via a feature engineering component;
 partitioning the energy consumption data via a data partitioning component after removing the one or more features; and
 predicting battery capacity of the battery storage unit via a neural network component sequentially executing three machine learning techniques,
 wherein the one or more features extracted from the energy consumption data include date, time, charging power, discharging power, maximum temperature, and battery state of charge (SoC).

14. The non-transitory computer-readable storage medium of claim 13, wherein the first machine learning technique is multiple linear regression (MLR), the second machine learning technique involves a neural network model, and the third machine learning technique is a Long Short-Term Memory (LSTM) neural network model.

15. The non-transitory computer-readable storage medium of claim 14, wherein test set data in the MLR technique are normalized by using a mean and standard deviation of training data.

16. The non-transitory computer-readable storage medium of claim 14, wherein the neural network model is trained to predict a battery faded capacity percentage.

17. The non-transitory computer-readable storage medium of claim 14, wherein the LSTM neural network model includes a selection gate, a forgetting gate, and an ignoring gate, where all weights of a graph are calculated so that a loss value is minimized with every input.

* * * * *